United States Patent
Yip

(10) Patent No.: US 9,721,622 B2
(45) Date of Patent: Aug. 1, 2017

(54) SYSTEMS WITH MEMORY SEGMENTATION AND SYSTEMS WITH BIASING LINES TO RECEIVE SAME VOLTAGES DURING ACCESSING

(71) Applicant: MICRON TECHNOLOGY, INC., Boise, ID (US)

(72) Inventor: Aaron Yip, Los Gatos, CA (US)

(73) Assignee: Micron Technology, Inc., Boise, ID (US)

(*) Notice: Subject to any disclaimer, the term of this patent is extended or adjusted under 35 U.S.C. 154(b) by 12 days.

(21) Appl. No.: 14/570,254

(22) Filed: Dec. 15, 2014

(65) Prior Publication Data

US 2015/0103578 A1    Apr. 16, 2015

Related U.S. Application Data

(63) Continuation of application No. 13/597,917, filed on Aug. 29, 2012, now Pat. No. 8,929,120.

(51) Int. Cl.
*G11C 5/06* (2006.01)
*G11C 13/00* (2006.01)
*G11C 7/18* (2006.01)

(52) U.S. Cl.
CPC .......... *G11C 5/06* (2013.01); *G11C 7/18* (2013.01); *G11C 13/0002* (2013.01); *G11C 13/003* (2013.01); *G11C 13/0023* (2013.01); *G11C 2213/72* (2013.01)

(58) Field of Classification Search
CPC ......... G11C 5/06; G11C 7/18; G11C 13/0002; G11C 13/003; G11C 13/0023; G11C 2213/72

See application file for complete search history.

(56) References Cited

U.S. PATENT DOCUMENTS

| | | |
|---|---|---|
| 4,747,083 A | 5/1988 | Nakajima et al. |
| 5,781,469 A | 7/1998 | Pathak et al. |
| 7,002,825 B2 | 2/2006 | Scheuerlein |
| 7,054,219 B1 | 5/2006 | Petti et al. |
| 7,106,652 B2 | 9/2006 | Scheuerlein |
| 7,733,685 B2 | 6/2010 | Scheuerlein et al. |
| 2005/0180203 A1 | 8/2005 | Lin et al. |
| 2009/0141535 A1 | 6/2009 | Yang et al. |
| 2010/0238697 A1 | 9/2010 | Juengling |
| 2010/0254175 A1 | 10/2010 | Scheuerlein |
| 2010/0271885 A1 | 10/2010 | Scheuerlein et al. |
| 2011/0116300 A1* | 5/2011 | Maejima ............... G11C 8/08 365/148 |
| 2011/0228587 A1 | 9/2011 | Ito |
| 2011/0242872 A1 | 10/2011 | Hanzawa |
| 2011/0261606 A1 | 10/2011 | Sandhu et al. |
| 2012/0099370 A1 | 4/2012 | Toda |

* cited by examiner

*Primary Examiner* — Pho M Luu
*Assistant Examiner* — Mohammed A Bashar
(74) *Attorney, Agent, or Firm* — Dicke, Billig & Czaja, PLLC

(57) ABSTRACT

Memory devices, memory arrays, and methods of operation of memory arrays with segmentation. Segmentation elements can scale with the memory cells, and may be uni-directional or bi-directional diodes. Biasing lines in the array allow biasing of selected and unselected select devices and segmentation elements with any desired bias, and may use biasing devices of the same construction as the segmentation elements.

21 Claims, 9 Drawing Sheets

Cross Point RRAM array

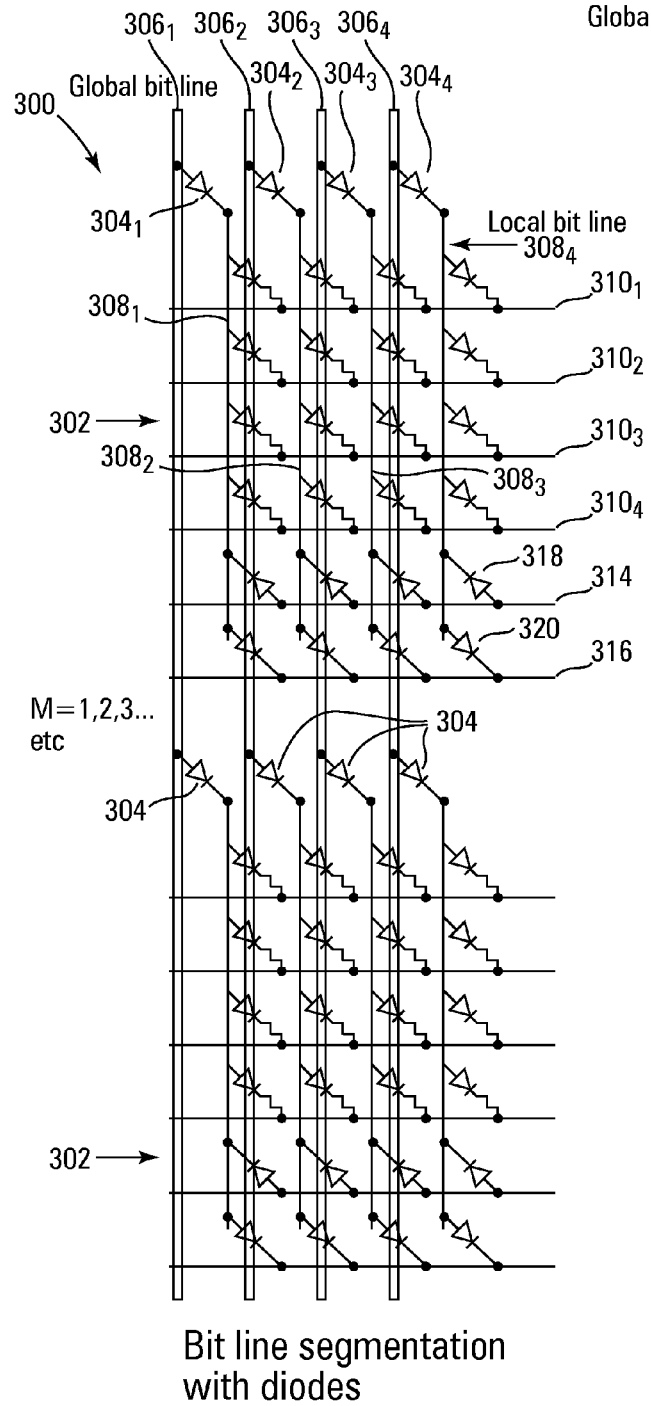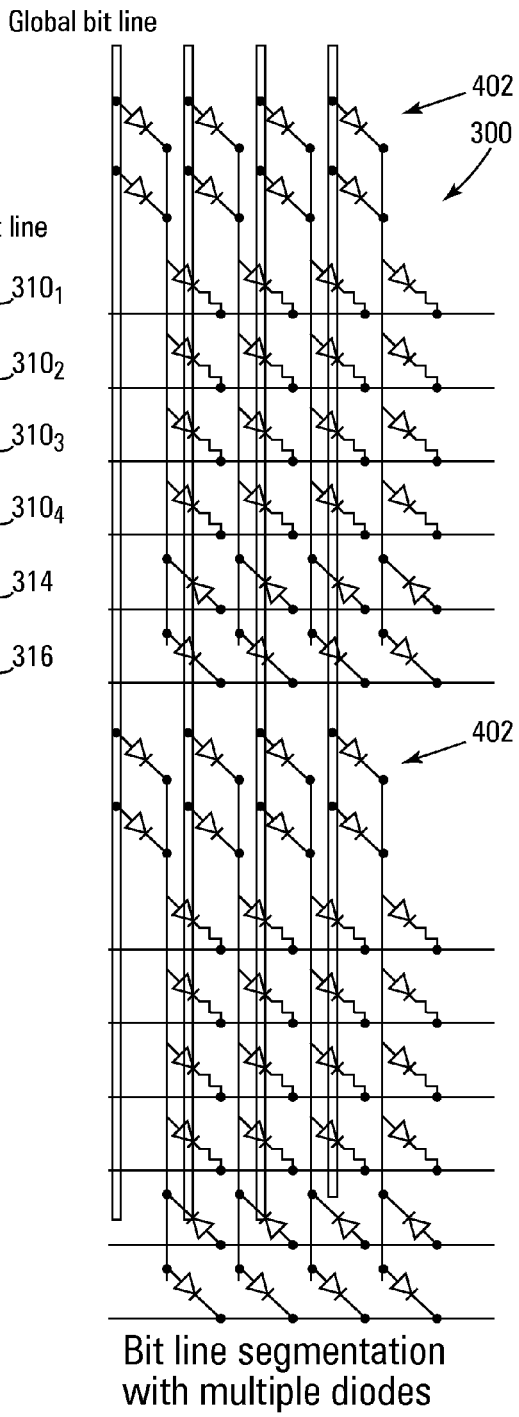
Bit line segmentation with diodes
FIG. 3
Bit line segmentation with multiple diodes
FIG. 4

SYSTEMS WITH MEMORY SEGMENTATION AND SYSTEMS WITH BIASING LINES TO RECEIVE SAME VOLTAGES DURING ACCESSING

RELATED APPLICATION

This application is a continuation of U.S. application Ser. No. 13/597,917, titled "DIODE SEGMENTATION IN MEMORY," filed Aug. 29, 2012 and issued as U.S. Pat. No. 8,929,120 on Jan. 6, 2015, which is commonly assigned and incorporated entirely herein by reference.

TECHNICAL FIELD

The present embodiments relate generally to memory and a particular embodiment relates to variable resistance memory devices.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

Flash memory density has increased and cost per bit has decreased in recent years. To increase density, memory cell size and proximity to adjacent memory cells have been reduced. This can lead to problems with disturb conditions resulting from interaction between adjacent memory cells. Additionally, flash memory is still relatively slow when compared to other forms of memory (e.g., DRAM).

Variable resistance memory, such as resistive random access memory (RRAM), is a memory technology that provides a non-volatile memory function in a variable resistance memory cell. For example, a low resistance of the memory cell indicates one state while a high resistance indicates a second state. Examples of such variable resistance memory includes metal oxide, phase change (GST), nano-filament, stiction force, mechanical deformation, polymer, molecular, conductive bridge, and MRAM.

FIG. 1 shows a typical cross point resistive RAM array, with a select device and a programmable element in series forming each cell at an intersection of a pair of access lines, which are referred to herein as bit lines and word lines, but which for the purposes of a RRAM are interchangeable. The select device is a non-ohmic device, such as a diode. A typical core cell size for RRAM cells is $4F^2$. That is, with F as the smallest feature size, the area of an RRAM cell on a die, including any overhead and spacing, is 2F by 2F, or $4F^2$.

Because of the size of modern arrays, the amount of current from a large amount of cells connected to an access line, and leakage from cells, bit lines and word lines cannot span an entire length and width of a memory. Connected to in this context includes, but is not limited to, being electrically connected to, whether directly or indirectly through an intervening component or components. Therefore, bit line and word line segmentation is used as is shown in FIG. 2. For segmenting bit lines or word lines, segmentation transistors such as transistors 202 are used. The segmentation transistors 202 are used to divide the array into smaller sections. It is difficult to fabricate small transistors, and it is difficult to tightly pack transistors. Further, as cells continue to scale smaller and smaller, transistors do not become smaller at the same rate. Segmentation transistors such as transistors 202 are far larger than the $4F^2$ size of typical RRAM cells, and as the density of arrays continues to increase, large segmentation transistors take up an increasing percentage of die space, reducing efficiency of the array.

For the reasons stated above, and for other reasons stated below that will become apparent to those skilled in the art upon reading and understanding the present specification, there is a need in the art for an improved memory array architecture.

BRIEF DESCRIPTION OF THE DRAWINGS

FIG. 3 is a partial circuit diagram of an RRAM memory array according to an embodiment of the present disclosure;
FIG. 4 is a partial circuit diagram of an RRAM memory array according to another embodiment of the present disclosure.

DETAILED DESCRIPTION

Figure 1:
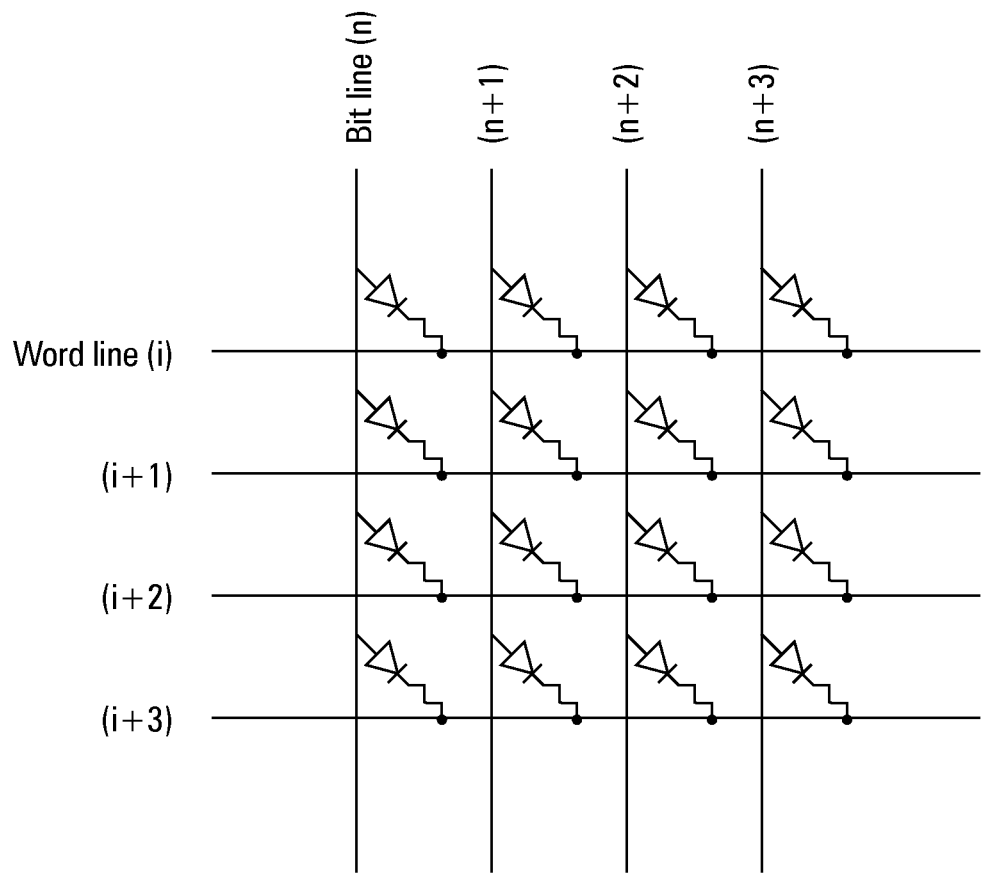
FIG. 1 is a portion of a typical RRAM memory array.
Figure 2:
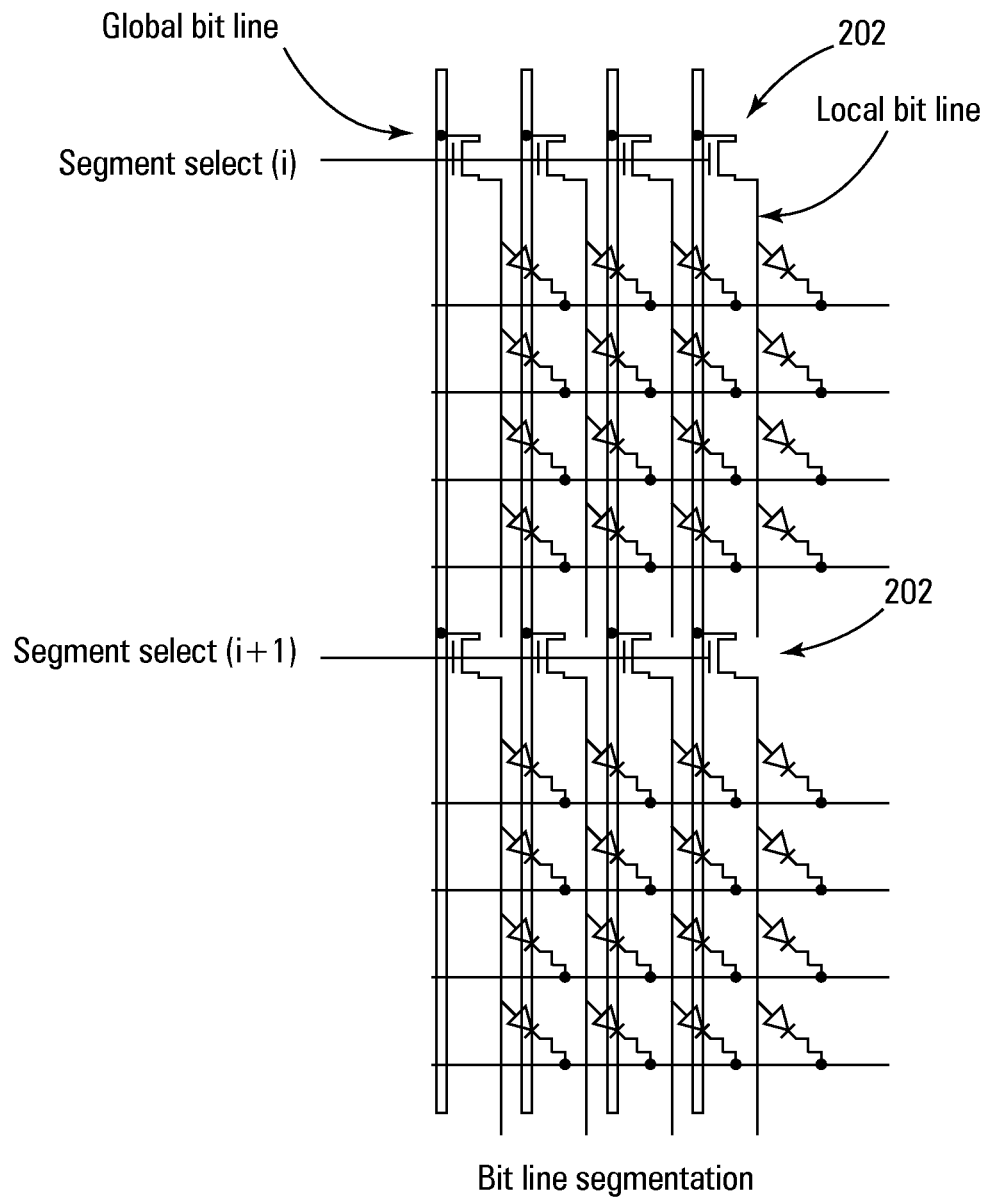
FIG. 2 is a portion of a segmented typical RRAM memory array.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Cross point RRAM array cells are a two tier stack of components. Typically, an RRAM array cell comprises a programmable element (e.g., a variable resistive element) that is usually either over or under a select device. The variable resistive element changes states, and the different states represent a programmed cell and an erased cell. The select device is used for the purpose of selecting the particular cell of interest in the array. A cross point array is so named because the access lines, referred to as bit lines and word lines, of the array cross at 90 degree angles, for example, forming a compact efficient array having a small area. The bit lines and word lines are typically sized as small as equipment can make them, and the spacing between adjacent bit lines and between adjacent word lines is also typically as small. For the purposes of explanation, bit lines are shown in the figures in a vertical direction, and word lines are shown in the figures in a horizontal direction. However, in RRAM, bit lines and word lines each function the same. That is, what are typically referred to as bit lines and word lines are in fact interchangeable in RRAM. Functionally, bit lines and word lines may be referred to generally as access lines. A string of memory cells is defined herein to be a group of memory cells that are each connected to a common access line, e.g., a group of memory cells each connected to a local bit line, with each local bit line connected to a global bit line by a segmentation element, a group of memory cells each connected to a local word line, with each local word line connected to a global word line by a segmentation element, or a group of memory cells each connected to a global access line.

The select device of a variable resistance memory cell is typically a diode. Since there are numerous types of variable resistive elements, in some RRAM memories the select devices may be uni-directional diodes, and in other RRAM memories the select devices may be bi-directional diodes. When bi-directional diodes are used as select devices, they may be symmetrical or non-symmetrical, that is, forward and reverse turn-on voltages for a non-symmetric bi-directional diode may be different. The choice of the programmable element typically dictates the choice of the select device. For example, a phase change memory may have all of its current flow in one direction, and as such, use a uni-directional select device. Conductive bridge memory may use current flow in different directions for programming and erasing, and as such, use a bi-directional select device.

A portion of a memory array 300 according to an embodiment of the disclosure is shown in FIG. 3. Array 300 comprises a plurality of blocks 302 divided by segmentation elements 304. Segmentation elements 304 comprise diodes in one embodiment, and may be identical to the select device for each variable resistance memory cell 312. Global bit lines 306 span multiple blocks, and are connected to local bit lines 308 of the blocks 302 by the segmentation elements 304 for the particular block. Word lines 310, which may be local word lines or global word lines, cross the local bit lines 308, and a variable resistance cell 312 is connected between each local bit line 308 and its crossing word line 310. Variable resistance cells comprise a select device (e.g., a diode) in series with a programmable element.

A pair of biasing lines 314 and 316 are also connected to the local bit lines 308 and run, in one embodiment, parallel to word lines 310. Each of the biasing lines 314, 316 is connected to a local bit line 308 by a respective bias device 318, 320, which comprises a select device, like a memory cell, but unlike a memory cell, does not include a programmable element. Biasing line 314 is connected to a plurality of local bit lines 308 by a plurality of biasing devices 318, each biasing device 318 connected between the line 314 and a respective one of the local bit lines 308 in one direction, and biasing line 316 is connected to a plurality of local bit lines 308 by a plurality of biasing devices 320, each biasing device 320 connected between the line 316 and a respective one of the local bit lines 308, in the opposite direction. For example, if the biasing devices 318 and 320 are uni-directional diodes, current flow for biasing devices 318 flows from line 314 to the local bit lines 308, and current flow for biasing devices 320 flows from the local bit lines 308 to line 316. The biasing lines can be used to forward or reverse bias the local bit lines for selecting or unselecting specific local bit lines.

The biasing devices and segmentation elements do use area in an array. Compared to the size of segmentation transistors, however, the area used by the biasing devices and segmentation elements combined is much smaller for each global bit line than by transistors. Further, the biasing devices and segmentation elements will scale with the memory cells, whereas transistors do not scale with the memory cells.

The segmentation elements are in one embodiment the same elements as are used for the select devices for the variable resistance memory cells. Compared to segmentation transistors, the segmentation elements 304 are much smaller in size, are much easier to fabricate, and can scale with the cells themselves. That is, as cell size decreases, the segmentation element size will also decrease, saving both cost and die area. As word lines and bit lines are interchangeable in RRAM, the segmentation of the array may be performed on either or both of the sets of bit lines and word lines without departing from the scope of the disclosure.

While a single global bit line to local bit line segmentation is shown, it should be understood that additional segmentation may be used without departing from the scope of the disclosure. For example, segmenting from a global bit line to a regional bit line, and then to a local bit line, may be used. The same sub-segmenting may also be used for word lines.

FIG. 4 shows an array 300 as in FIG. 3, except using two segmentation elements 402 in parallel between global bit lines 306 and local bit lines 308 instead of a single segmentation element 304. In some applications, a segmentation element of the same size as the select devices in the array may not be able to conduct enough current to operate the string of cells. It should be understood that the number of segmentation elements placed in parallel between the global bit lines and local bit lines may increase without departing from the scope of the disclosure.

Programming or erasing a variable resistance memory cell comprises applying a forward or reverse bias across it. The differences between read, program, and erase operations are determined by the cell itself, and voltage and/or current magnitude, duration, bias (reverse or forward), and timing and/or waveform. Some variable resistance memory cells use bi-directional current flow for operation, and some use uni-directional current flow. What distinguishes them is the waveform. For uni-directional cells, the select device is uni-directional, and for bi-directional cells, the select device is bi-directional.

Figure 5:
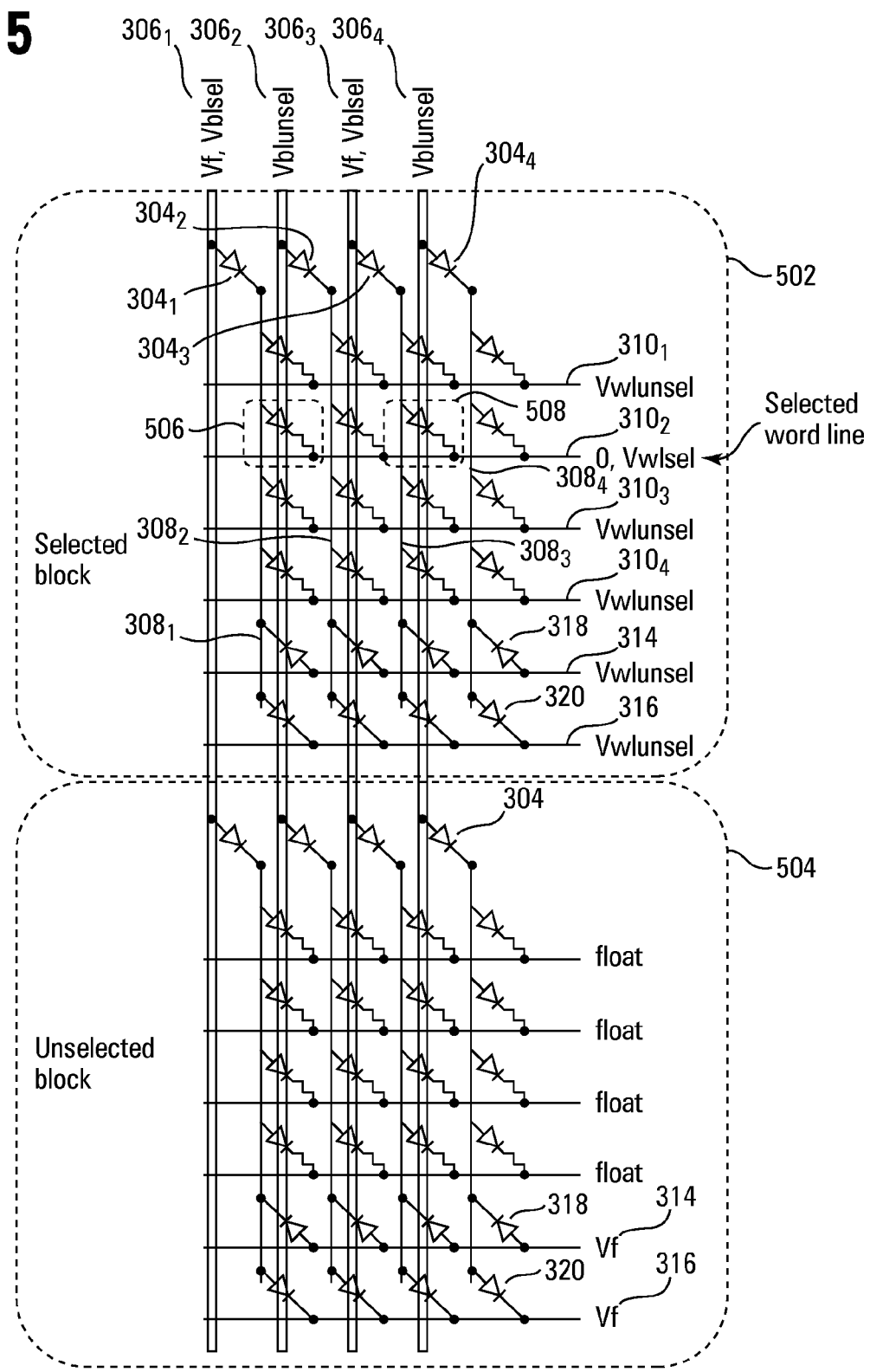
FIG. 5 is a diagram showing operation of a portion of the RRAM memory array of FIG. 3.
Figure 6:
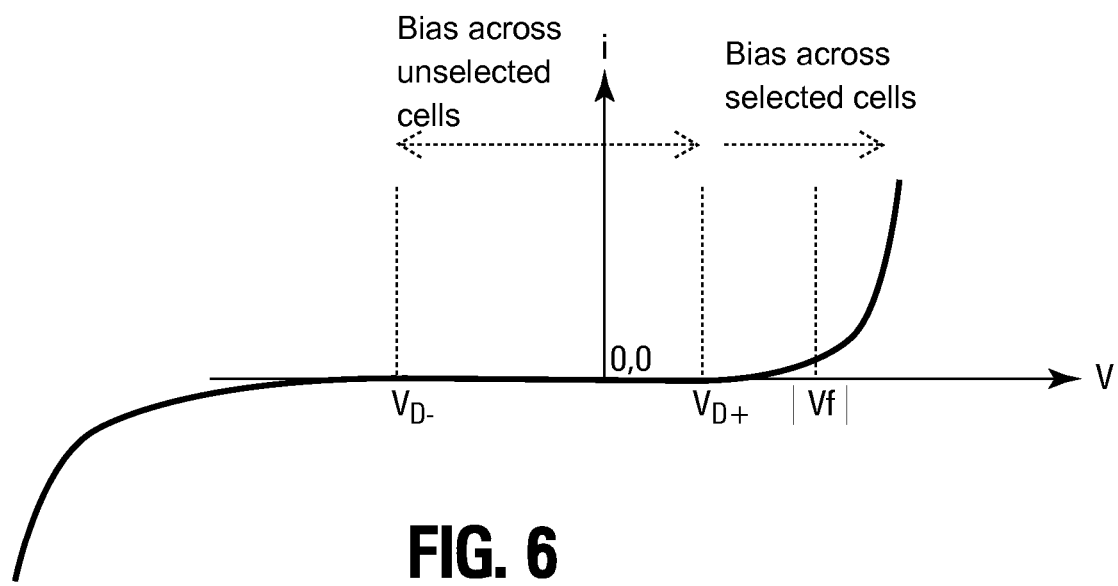
FIG. 6 is a voltage/current curve for the operation of the RRAM memory array of FIG. 5.
Figure 7:
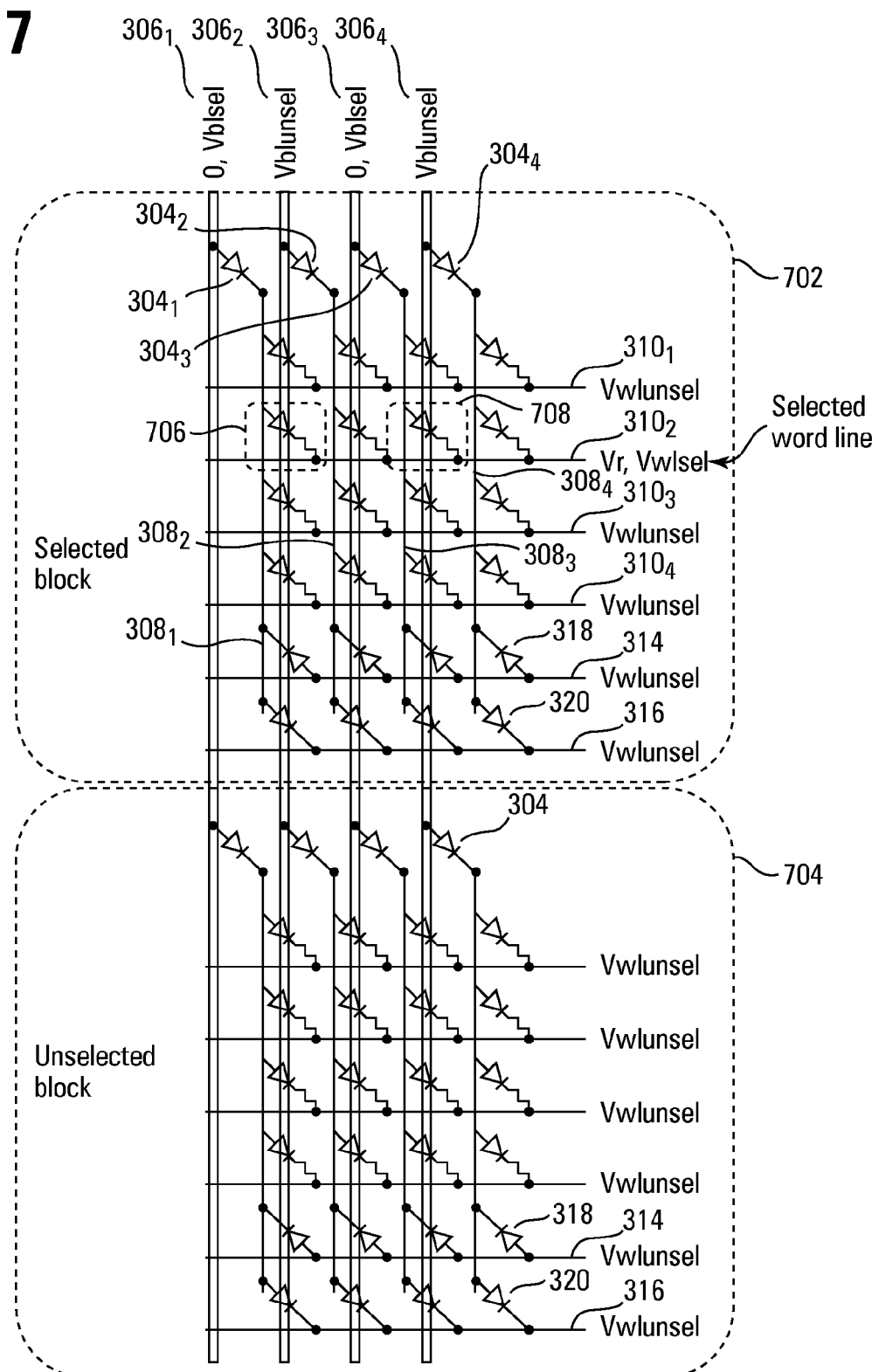
FIG. 7 is a diagram showing another operation of a portion of the RRAM memory array of FIG. 3.
Figure 8:
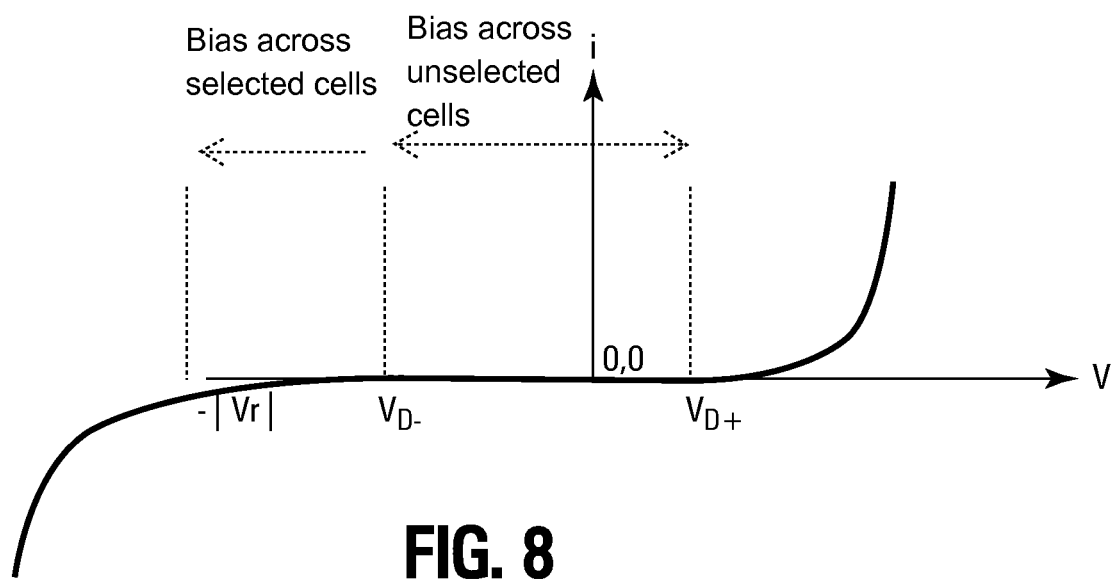
FIG. 8 is a voltage/current curve for the operation of the RRAM memory array of FIG. 7.

Forward and reverse biasing cells for operation is shown in greater detail in FIGS. 5-8. FIGS. 5 and 6 show forward biasing of selected cells in selected and unselected blocks, and FIGS. 7 and 8 show reverse biasing of selected cells in selected and unselected blocks. Methods are further described with respect to FIGS. 9 and 10.

Appropriate voltages for forward and reverse biasing cells will vary depending upon, e.g., the turn-on voltage of the select devices, the leakage tolerance for the array, and the size and characteristics of the cells and the select devices. However, for forward biasing, voltages that are sufficient to turn on the select device for a selected cell, and to reduce leakage or turn off select devices for unselected cells and blocks are chosen. Diodes can leak current when a bias below a turn-on voltage is applied to them. The amount of leakage depends on the actual voltage applied, and voltages in one embodiment are chosen to keep unselected diodes off or to keep the leakage below an acceptable amount, the acceptable amount determined by the application of the array.

In FIG. 5, two blocks, selected block 502 and unselected block 504, are shown. Cells 506 and 508 are selected cells. To forward bias the cells 506 and 508, the bit lines and word lines that intersect at those cells have a voltage applied to them that is sufficient to forward bias the select device of the cell. For selected block 502, global bit lines $306_1$ and $306_3$, which connect to local bit lines $308_1$ and $308_3$ through segmentation elements $304_1$ and $304_3$, are biased at a bit line select voltage Vblsel sufficient to turn on the segmentation elements and select devices (Vf). Unselected bit lines $306_2$ and $306_4$ are biased at a bit line unselect voltage Vblunsel. Vblunsel is chosen in one embodiment to reduce leakage to an acceptable level for the function of the array, and/or to reduce stress on the segmentation elements connected to unselected bit lines, and/or to ensure reverse biasing of the segmentation elements and/or the select devices connected to unselected bit lines. The selected word line $310_2$ is biased at a word line select voltage Vwsel, in one embodiment a reference voltage (e.g., 0 or ground), and unselected word lines are biased at a word line unselect voltage Vwlunsel, chosen the same way as the bit line unselect voltages are chosen, that is what is appropriate to turn the unselected select devices off or to reverse bias them. The biasing lines 314 and 316 in the selected block 502 are also biased with Vwlunsel, so that the select devices of unselected cells in the selected block remain turned off.

In the unselected block 504, word lines are left floating, and the forward bias voltage Vf is applied to the biasing lines. This places Vf minus a threshold voltage of biasing devices 318 on the local bit lines, and keeps segmentation elements 304 of the unselected block 504 off. For some modes of operation, it may be desired to lower the local bit lines of a block below a certain level. This may be accomplished in one embodiment by lowering the voltage bias applied to biasing line 316 below zero volts, for example to −2.5 volts. This will drag the local bit lines to a threshold voltage above −2.5. It can be seen that application of biasing voltages to the biasing lines allows for pulling up or dragging down the bias of the local bit lines to any desired level. A voltage versus current curve for FIG. 5 is shown in FIG. 6.

In FIG. 7, two blocks, selected block 702 and unselected block 704, are shown. Cells 706 and 708 are selected cells. To reverse bias the cells 706 and 708 in the selected block 702, the forward bias conditions from FIG. 5 can be reversed. Where FIG. 5 had a reference voltage (e.g., 0 or ground), a reverse bias voltage Vr is applied. The bit lines and word lines that intersect at those cells have a voltage applied to them that is sufficient to reverse bias the select device of the cell. For selected block 702, global bit lines $306_1$ and $306_3$, which connect to local bit lines $308_1$ and $308_3$ through segmentation elements $304_1$ and $304_3$, are biased at a bit line select voltage Vblsel of a reference voltage (e.g., 0 or ground) sufficient to reverse bias the segmentation elements and select devices. Unselected bit lines $306_2$ and $306_4$ are biased at a bit line unselect voltage Vblunsel. Vblunsel is chosen in one embodiment to reduce leakage to an acceptable level for the function of the array, and/or to reduce stress on the segmentation elements connected to unselected bit lines, and/or to ensure reverse biasing of the segmentation elements and/or the select devices connected to unselected bit lines. The selected word line $310_2$ is biased at a word line select voltage Vwsel, in one embodiment a reverse bias voltage Vr, and unselected word lines are biased at a word line unselect voltage Vwlunsel, chosen the same way as the bit line unselect voltages are chosen, that is what is appropriate to turn the unselected select devices off or to reverse bias them. The biasing lines 314 and 316 in the selected block 702 are also biased with Vwlunsel, so that the select devices of unselected cells in the selected block remain turned off.

In unselected block 704, word line unselect voltage Vwlunsel is applied to all word lines and to the biasing lines 314 and 316, sufficient to keep segmentation elements 304 in unselected block 704 off. A voltage versus current curve for FIG. 7 is shown in FIG. 8.

Figure 9:
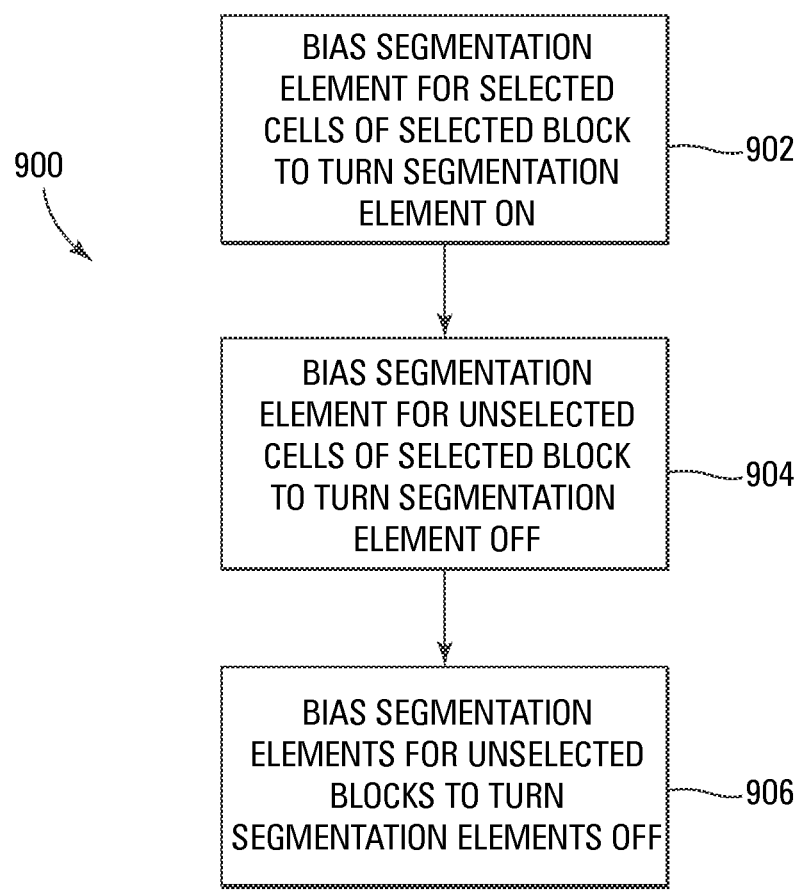
FIG. 9 is a flow chart diagram of a method according to an embodiment of the present disclosure.

A method 900 of operating a memory is shown in flow chart form in FIG. 9. Method 900 comprises biasing a two terminal segmentation element for selected cells of a selected block of the memory to turn the segmentation element on in block 902, biasing a two terminal segmentation element for unselected cells of a selected block of the memory to turn the segmentation element off in block 904, and biasing segmentation elements for unselected blocks of the memory to turn the segmentation elements off in block 906. In further embodiments, a pair of biasing lines in the array, as described above, may be biased to reverse bias select devices of unselected cells of the memory, or may be biased to apply nearly any bias to unselected cells of the memory and to local access lines of the memory. In one embodiment, biasing the segmentation element comprises biasing a diode connected between a global access line of the memory and a local access line of the memory. Reverse biasing segmentation elements for unselected blocks of the memory comprises in one embodiment biasing a plurality of diodes, each diode connected between a biasing line and a respective local access line.

Figure 10:
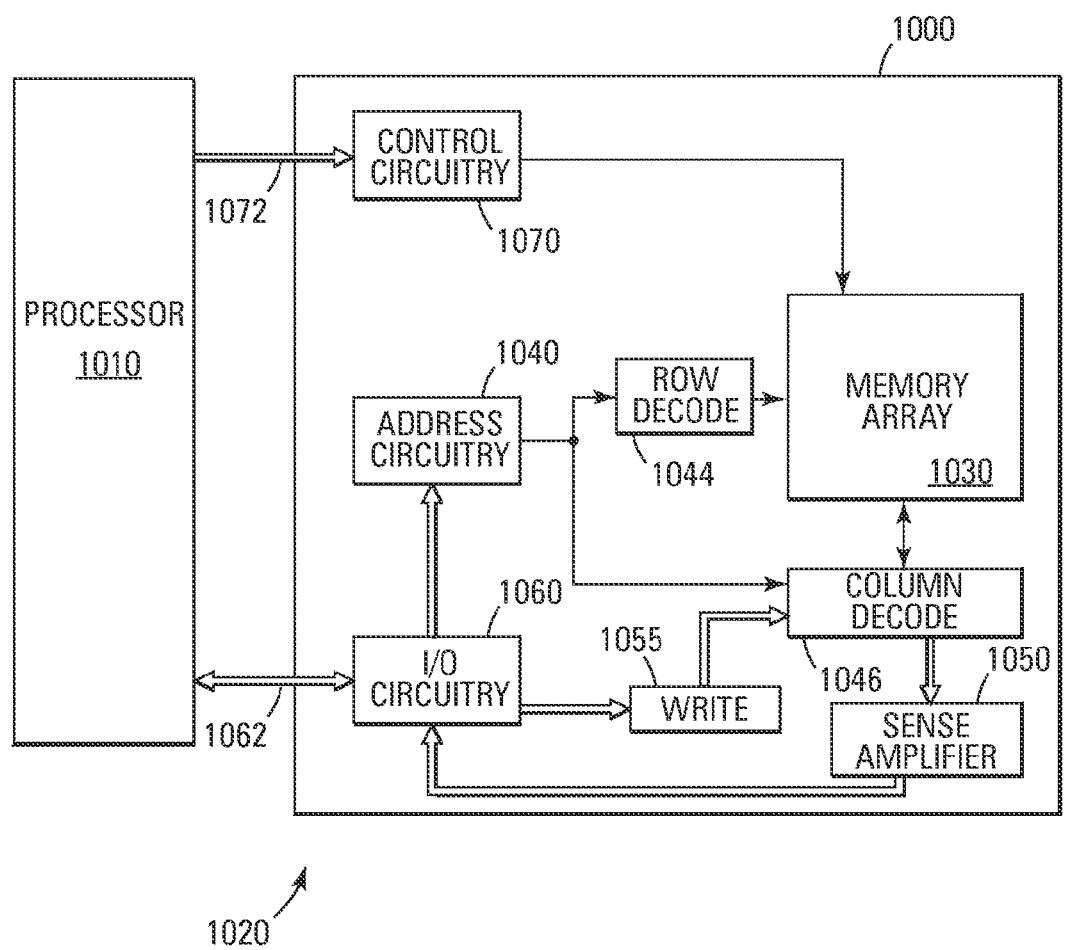
FIG. 10 is a block diagram of one embodiment of a memory system that can incorporate the memory array of FIG. 3 or 4.

FIG. 10 illustrates a functional block diagram of a memory 1000. The memory 1000 is coupled to an external processor 1010. The processor 1010 may be a microprocessor or some other type of controller. The memory 1000 and the processor 1010 form part of a memory system 1020. The memory 1000 has been simplified to focus on features of the memory that are helpful in understanding the present embodiments.

The memory 1000 includes an array 1030 of memory devices such as the arrays of FIGS. 3 and 4. The memory array 1030 may be arranged in banks of word line rows and bit line columns. In one embodiment, the columns of the memory array 1030 comprise series strings of memory devices 210.

Address buffer circuitry 1040 is provided to latch address signals provided through I/O circuitry 1060. Address signals are received and decoded by a row decoder 1044 and a column decoder 1046 to access the memory array 1030. It will be appreciated by those skilled in the art with the benefit of the present description that the number of address input connections depends on the density and architecture of the memory array 1030. That is, the number of addresses increases with both increased memory cell counts and increased bank and block counts.

The memory 1000 reads data in the memory array 1030 by sensing voltage or current changes in the memory array columns using sense amplifier circuitry 1050. The sense amplifier circuitry 1050, in one embodiment, is coupled to read and latch a row of data from the memory array 1030. Data input and output buffer circuitry 1060 is included for bidirectional data communication as well as the address communication over a plurality of data connections 1062 with the controller 1010. Write circuitry 1055 is provided to write data to the memory array.

Memory control circuitry 1070 decodes signals provided on control connections 1072 from the processor 1010. These signals are used to control the operations on the memory array 1030, including data read, data write (program), and erase operations. The memory control circuitry 1070 may be a state machine, a sequencer, or some other type of controller to generate the memory control signals. In one embodiment, the memory control circuitry 1070 is configured to control the timing and generation of voltages for the methods for sensing, programming, and erasing of memory cells.

The memory device illustrated in FIG. 10 has been simplified to facilitate a basic understanding of the features of the memory. A more detailed understanding of internal circuitry and functions of resistive memories are known to those skilled in the art.

CONCLUSION

In summary, one or more embodiments provide a memory array with segmentation. The segmentation elements scale with the memory cells, and may be uni-directional or bi-directional diodes. Biasing lines in the array allow biasing of selected and unselected select devices and segmentation elements with any desired bias.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A system, comprising:
   a controller; and
   a memory device coupled to the controller, the memory device comprising:
      a memory cell connected between a local first access line and a second access line;
      a first biasing device is between and connected to a first biasing line and the local first access line, wherein the first biasing device is configured to selectively allow current to flow between the first biasing line and the local first access line; and
      a second biasing device is between and connected to a second biasing line and the local first access line, wherein the second biasing device is configured to selectively allow current to flow between the second biasing line and the local first access line;
   wherein the first and second biasing lines are to receive a same voltage during an access operation.

2. The system of claim 1, further comprising a segmentation element connected between the local first access line and a global first access line.

3. The system of claim 2, wherein the segmentation element comprises a select device.

4. The system of claim 2, wherein the segmentation element is a first segmentation element, and further comprising a second segmentation element connected between the local first access line and the global first access line in parallel with the first segmentation element.

5. The system of claim 1, wherein the first biasing device being configured to selectively allow current to flow between the first biasing line and the local first access line comprises the first biasing device being configured to selectively allow current to flow from the first biasing line to the local first access line, and wherein the second biasing device being configured to selectively allow current to flow between the second biasing line and the local first access line comprises the second biasing device being configured to allow current to flow from the local first access line to the second biasing line.

6. The system of claim 1, wherein the memory cell is a variable resistance memory cell.

7. The system of claim 1, wherein the memory cell comprises a select device connected to a programmable element.

8. The system of claim 1, wherein the first biasing device and the second biasing device each comprise a select device.

9. A system, comprising:
   a controller; and
   a memory device coupled to the controller, the memory device comprising:
      a memory cell connected between a local first access line and a second access line; and
      first and second select devices connected in parallel between the local first access line and a global access line, wherein the first select device is configured to selectively allow current to flow through the first select device from the global access line to the local first access line and the second select device is configured to selectively allow current to flow through the second select device from the global access line to the local first access line.

10. The system of claim 9, wherein the first and second select devices are diodes.

11. The system of claim 9, further comprising:
    a third select device connected between a first biasing line and the local first access line; and
    a fourth select device connected between a second biasing line and the local first access line.

12. The system of claim 11, wherein the third and fourth select devices are diodes.

13. The system of claim 9, wherein the memory cell comprises a select device coupled to a programmable element.

14. The system of claim 13, wherein the select device coupled to the programmable element is a diode.

15. A method of operating a memory, comprising:
    turning on a segmentation element that is between and connected to a selected global access line and a local first access line, wherein a selected memory cell is between and connected to the local first access line and a second access line, and wherein the segmentation element is configured to allow current flow through the segmentation element from the selected global access line to the local first access line when the segmentation element is turned on;
    applying a bias voltage to the second access line that forward biases a select device of the selected memory cell;
    applying a bias voltage to a first biasing line connected to the local first access line; and
    applying a bias voltage to a second biasing line connected to the local first access line.

16. The method of claim 15, wherein applying the bias voltage to the first biasing line and applying the bias voltage to the second biasing line comprises applying a same bias voltage to the first and second biasing lines.

17. The method of claim 15, further comprising applying a bias voltage to a third access line to reverse bias a select device of an unselected memory device connected between the third access line and a local fourth access line.

18. The method of claim 15, further comprising applying a bias voltage to a third access line to turn off a select device of an unselected memory device connected between the third access line and a local fourth access line, wherein the first biasing line is connected to the local fourth access line and the second biasing line is connected to the local fourth access line, and wherein applying the bias voltage to the first biasing line and applying the bias voltage to the second biasing line cause the select device of the unselected memory cell to remain turned off.

19. The method of claim 15, further comprising reverse biasing another segmentation element that connects an unselected global access line to a local third access line wherein an unselected memory cell is connected between the local third access line and a fourth access line.

20. A method of operating a memory, comprising:
reverse biasing a segmentation element that is between and connected to a selected global access line and a local first access line, wherein a selected memory cell is between and connected to the local first access line and a second access line, and wherein the segmentation element is configured to allow current flow through the segmentation element from the selected global access line to the local first access line when the segmentation element is forward biased and to inhibit current flow through the segmentation element from the selected global access line to the local first access line when the segmentation element is reverse biased;
applying a bias voltage to the second access line that reverse biases a select device of the selected memory cell;
applying a bias voltage to a first biasing line that is connected to the local first access line; and
applying a bias voltage to a second biasing line that is connected to the local access line.

21. The method of claim 20, wherein applying the bias voltage to a first biasing line and applying the bias voltage to a second biasing line comprises applying a same bias voltage to the first and second biasing lines.

* * * * *